United States Patent [19]

Yamazaki et al.

[11] Patent Number: 5,194,934
[45] Date of Patent: Mar. 16, 1993

[54] MOUNTING STRUCTURE FOR A SEMICONDUCTOR CHIP HAVING A BUFFER LAYER

[75] Inventors: Shunpei Yamazaki, Tokyo; Takeshi Oka, Takatsuki; Akira Mase, Atsugi, all of Japan

[73] Assignee: Semiconductor Energy Laboratory Co., Ltd., Kanagawa, Japan

[21] Appl. No.: 855,481

[22] Filed: Mar. 23, 1992

Related U.S. Application Data

[63] Continuation of Ser. No. 384,697, Jul. 26, 1989, abandoned.

[30] Foreign Application Priority Data

Jul. 27, 1988 [JP] Japan .................. 63-189316

[51] Int. Cl.[5] .................. H01L 23/12; H01L 23/14
[52] U.S. Cl. .................. 257/782; 257/753
[58] Field of Search .................. 357/67, 68, 80, 75, 357/74, 73, 72; 350/339 R, 339 F, 334, 336; 174/52.4

[56] References Cited

U.S. PATENT DOCUMENTS

| | | | |
|---|---|---|---|
| 4,352,120 | 9/1982 | Kurihara et al. | 357/75 |
| 4,556,899 | 12/1985 | Kurihara et al. | 357/80 |
| 4,643,526 | 2/1987 | Watanabe et al. | 350/339 |
| 4,672,421 | 6/1987 | Liz | 357/80 |
| 4,729,010 | 3/1988 | Tsuchiya et al. | 357/70 |
| 4,744,637 | 5/1988 | Sekimura et al. | 350/339 |
| 4,826,297 | 5/1989 | Kubo et al. | 357/80 |
| 4,855,872 | 8/1989 | Wojnar et al. | 361/412 |
| 4,872,047 | 10/1989 | Fister et al. | 357/67 |

FOREIGN PATENT DOCUMENTS

| | | | |
|---|---|---|---|
| 55-62777 | 5/1980 | Japan | 357/80 |
| 56-13739 | 2/1981 | Japan | 357/80 |
| 58-10841 | 1/1983 | Japan | 357/72 |
| 2-306641 | 12/1990 | Japan | 357/80 |
| 3-179778 | 8/1991 | Japan | 357/80 |
| 2097998 | 10/1982 | United Kingdom | 357/80 |

Primary Examiner—Rolf Hille
Assistant Examiner—S. V. Clark
Attorney, Agent, or Firm—Sixbey, Friedman, Leedom & Ferguson

[57] ABSTRACT

A semiconductor device is comprised of glass substrate, an epoxy-phenol resin for buffer means formed on the glass substrate, a set of electrical wiring provided on the epoxy-phenol resin and a semiconductor chip provided with a bump of gold and bonded to the electric wiring with therebetween chip provided with the bump therebetween using a photo-cured type of an epoxy resin.

8 Claims, 2 Drawing Sheets

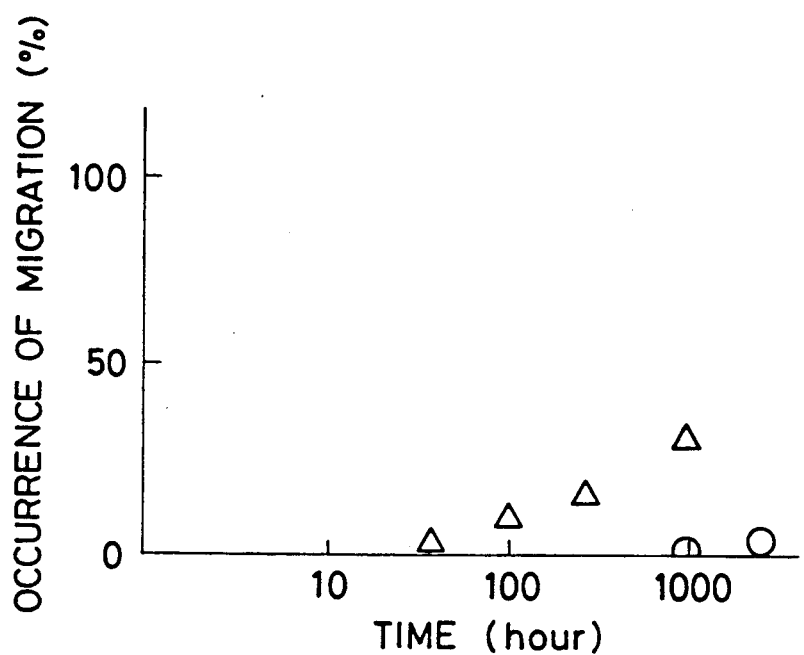
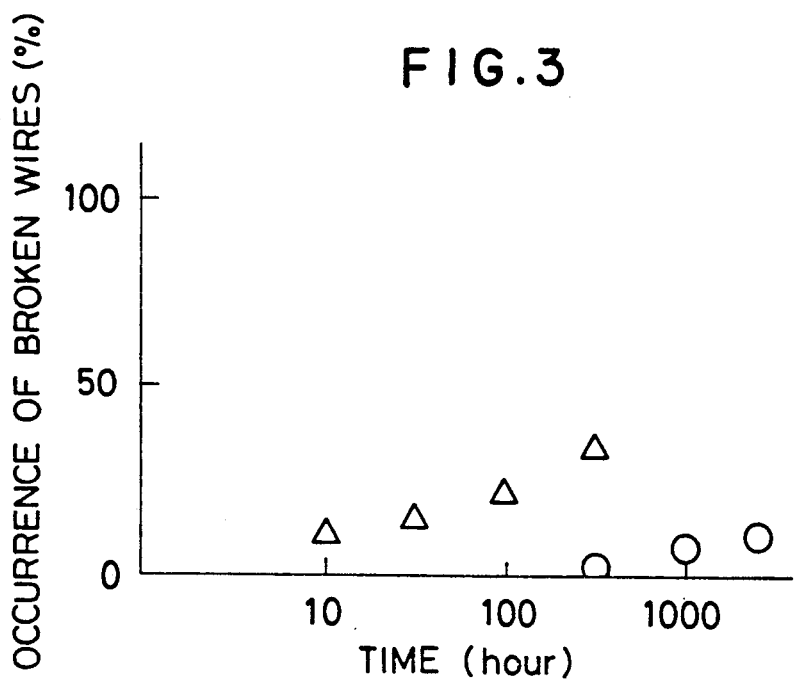

MOUNTING STRUCTURE FOR A SEMICONDUCTOR CHIP HAVING A BUFFER LAYER

This application is a continuation of Ser. No. 07/384,697, filed Jul. 26, 1989, now abandoned.

BACKGROUND OF THE INVENTION

1. Field of the Invention

The present invention relates to a mounting structure for a semiconductor chip, specifically to a mounting structure wherein a semiconductor chip is mounted directly on an exothermic substrate for a thermal head, a photoreceptor element substrate for an image sensor, or a liquid crystal display substrate in order to provide a semiconductor device in low cost and light weight. The present invention also relates to a mounting method for a semiconductor chip to provide the mounting structure mentioned above.

2. Description of the Prior Art

Conventionally, the driving circuit of a conventional liquid crystal display element and the like is provided with a circuit formed from a copper foil on a glass-epoxy substrate, and is fabricated by soldering to an IC package. Such circuits are attached, one by one, to the electrode on the display substrate by FPC.

In addition, in order to eliminate the glass-epoxy substrate, there is a method known as the TAB method in which the chip is connected to wiring on a flexible substrate using a film of a polyimide type of resin as a base and an electrode terminal provided on the end of the film is connected to an electrode on a display substrate; and also there is a method known as the so-called flip chip method in which a bump of solder is provided on an IC pad and a solder-to-solder connection is performed by providing an opposing electrode with a solder-coated section.

However, because a substrate for a circuit must be provided in addition to a display device, the display product is very difficult to be manufactured in light weight and low cost. In addition, although the TAB method has the objective of providing light weight, there is the problem that the forming of the tape used is too costly.

And in the formation of the solder bump in the flip chip method there is the problem that in order to avoid short circuits between adjacent bumps the degree of integration of the electrode formed on the IC substrate is not increased.

A method has also been proposed in which the substrate and semiconductor chip are electrically connected face down using a photo-cured type resin. However, the thermal expansion of the resin is comparatively large and, when the mounting process is carried out at room temperature(about 25° C.), poor reliability of the joint section results at high temperatures.

If the electrical wiring is formed by the method of printing a conducting paste directly on a glass substrate or the like, when thermal shock is encountered, broken wires occur because the coefficients of thermal expansion of the substrate and the conducting paste differ by one order of magnitude. In addition, when an organic material on a glass substrate is used as a binder in conductive wiring, migration occurs very easily between the fine wires on the substrate surface, so that long-term reliability is not obtained.

SUMMARY OF THE INVENTION

An object of the present invention is, with due consideration to the drawbacks of such conventional methods, to provide a mounting structure for a semiconductor chip wherein a film of a material with a coefficient of thermal expansion between that of a substrate and that of the electrical wiring is formed to a thickness of 2 to 50 $\mu$m on the substrate which is insulated at its surface and transmits light at least in the wavelengths of 320 to 400 nm. Subsequently, electrical wiring is formed by a method of printing using a paste containing conductive metallic particles of at least one member selected from the group consisting of Fe, Cu, Ag, Pd-Ag, Pt, Al, C, Sn, In, Ni, Ta, Ti, Sb, and Mo. Then in order to obtain electrical contact between the upper part of the wiring and the bump which is formed on the semiconductor chip and of which the surface at least is formed from gold, copper, or solder, they are mechanically contacted each other by bonding the substrate and the semiconductor chip by the use of an ultraviolet-cured epoxy resin.

The coefficient of thermal expansion of the material used as the substrate is in the range of $1 \times 10^{-6}$ to $9 \times 10^{-6}$ deg$^{-1}$, while the coefficient of thermal expansion of the electrical wiring material is $1 \times 10^{-4}$ deg$^{-1}$, and a buffer layer of the order of $10^{-5}$ deg$^{-1}$ is interposed between the two materials.

An organic material such as a phenol resin or an acrylic resin or the like, or a compound material of these organic materials with an inorganic material such as $SiO_2$ or the like can be used for this buffer layer.

BRIEF DESCRIPTION OF THE DRAWINGS

These and other objects, features, and advantages of the present invention will become more apparent from the following description of the preferred embodiments taken in conjunction with the accompanying drawings, in which;

FIG. 2 and 3 are graphs showing a reliability data for the mounting structure of the present invention.

DETAILED DESCRIPTION OF THE PREFERRED EMBODIMENTS

Figure 1:
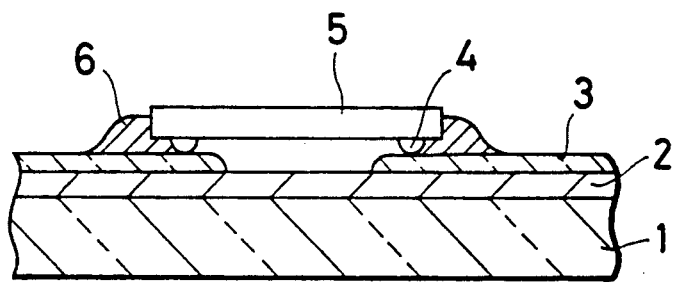
FIG. 1 is a partial cross sectional view showing a mounting structure of the present invention.

Now referring to FIG. 1, a semiconductor device in this embodiment of the present invention is comprised of a glass substrate 1 (in this embodiment, Corning #7059) which is 1.1 mm thick and transmits light at a wavelength of 365 nm, an epoxyphenol resin 2 formed on the glass substrate 1, a set of electrical wiring 3 provided on the epoxy-phenol resin 2 and a semiconductor chip 5 provided with a bump 4 of gold and bonded to the electrical wiring 3 with the bump 4 therebetween using a photo-cured type of an epoxy resin 6 which absorbs light at 365 nm.

In this embodiment the coefficient of thermal expansion of the glass substrate 1 is $4.6 \times 10^{-6}$ deg$^{-1}$ and the coefficient of thermal expansion of the epoxy-phenol resin 2 is $4.42 \times 10^{-5}$ deg$^{-1}$ and the coefficient of thermal expansion of the electrical wiring 3 is $1 \times 10^{-4}$ deg$^{-1}$.

It should be noted that, in the present invention, the epoxy-phenol resin 2 functions as a buffer layer, and that the electrical wiring 3 is not formed directly on the substrate 1, but is formed on the buffer layer 2. Furthermore, because this buffer layer 2 is formed by a heating process, no moisture exists between the buffer layer 2 and the UV-cured resin 6. Therefore, migration between the wires in the wiring 3 is minimized.

On the other hand, with conventional technology, the electrical wiring is formed directly on the substrate without the buffer layer as used in the present invention, then an ultraviolet-cured resin is laid over the electrical wiring. At this time moisture exists in the spaces between the wires, specifically between the substrate and the UV-cured resin and migration between the wires in the wiring 3 occurs because of this moisture.

The semiconductor device in this embodiment was produced in the following method. The epoxy-phenol resin 2 was printed to a depth of 30 μm by a suitable printing method on the glass substrate 1. Subsequently the resin 2 was fired for 30 minutes in $N_2$ at 150° C. An epoxy resin paste containing particles of silver was printed on top of the resin 2 by a screen method to a depth of about 25 μm, after which the set of electrical wiring 3 was provided by firing for 30 minutes in $N_2$ at 150° C.

The epoxy resin 6 was put on the semiconductor chip 5 whose output end has the bump 4 which is obtained by plating an output end of the chip 5 with gold. After the bump is aligned with the wiring 3, a load of 12 to 13.5 $Kg/cm^2$ was applied to bond the semiconductor chip 5 to the substrate 1. 2000 $mJ/cm^2$ of energy was then radiated from the substrate side by means of a high pressure mercury lamp with a peak emission of 365 nm to complete the mounting of the IC chip.

FIG. 2 shows the percentage of occurrence of migration in both the structure of the present invention and a conventional structure. Specifically, the probability(%) of the occurrence of migration is shown as a function of time, in the cases with and without a buffer layer.

In FIG. 2, the Δ symbol indicates the plot for the conventional structure while the o symbol indicates the plot for the structure of the present invention. These reliability tests were performed on 1000 samples.

It can be clearly understood from this graph that the percentage of migration is smaller in the case of the structure of the present invention than that in the conventional case.

FIG. 3 shows the percentage of occurrence of broken wires. Specifically, the probability(%) of the occurrence of broken wires is shown as a function of time, in the cases with and without a buffer layer.

In FIG. 3, the Δ symbol indicates the plot for the conventional structure while the o symbol indicates the plot for the structure of the present invention. These reliability tests were performed on 1000 samples.

It should be understood that use of the structure of the present invention can greatly improve the reliability in preventing broken wires caused by thermal distortion.

The reliability can be improved with no increase in the manufacture cost.

Since other modification and changes will be apparent to those skilled in the art, the invention is not considered limited to the examples chosen for purposes of disclosure, and covers all changes and modifications which do not constitute departures from the true spirit and scope of this invention.

What is claimed is:

1. A mounting structure for a semiconductor chip comprising:
   a glass substrate;
   a conductive pattern comprising conductive particles formed on said substrate; and
   a buffer film interposed between said substrate and said conductive pattern, wherein the coefficient of thermal expansion of said buffer film is larger than that of the substrate and less than that of the conductive pattern;
   wherein one side of said buffer film is in direct contact with the conductive pattern and the other side thereof is in direct contact with the substrate.

2. The mounting structure of claim 1 wherein said substrate is transparent for the light at least with respect to the wavelength of 320-420 nm.

3. The mounting structure of claim 1 wherein said conductive pattern is formed by printing an organic paste containing conductive particles.

4. The mounting structure of claim 1 wherein said buffer film is an organic film.

5. The mounting structure of claim 1 wherein said semiconductive chip is electrically connected to said conductive pattern through bumps.

6. A mounting structure for a semiconductor chip comprising:
   a glass substrate; the semiconductor chip mounted on said substrate by virtue of a UV-cured resin,
   wherein a buffer layer is interposed between said glass substrate and said UV-cured resin and the coefficient of thermal expansion of said buffer layer is larger than that of said glass substrate.

7. The mounting structure of claim 6 wherein said buffer layer is in direct contact with the substrate.

8. The structure of claim 2 wherein said conductive particles comprise a metal selected from the group consisting of Fe, Cu, Ag, Pd-Ag, Pt, Al, C, Sn, In, Ni, Ta, Ti, Sb and Mo.

* * * * *